United States Patent
Dong et al.

(10) Patent No.: US 12,199,407 B1
(45) Date of Patent: Jan. 14, 2025

(54) FREQUENCY STABILIZATION METHOD AND SYSTEM FOR TUNABLE LIGHT SOURCES BASED ON CHARACTERISTIC CURVE RECONSTRUCTION

(71) Applicant: Harbin Institute of Technology, Harbin (CN)

(72) Inventors: Yisi Dong, Harbin (CN); Wenwen Li, Harbin (CN); Wenrui Luo, Harbin (CN); Chen Zhang, Harbin (CN); Jinran Zhang, Harbin (CN); Pengcheng Hu, Harbin (CN); Ruitao Yang, Harbin (CN)

(73) Assignee: Harbin Institute of Technology, Harbin (CN)

( * ) Notice: Subject to any disclaimer, the term of this patent is extended or adjusted under 35 U.S.C. 154(b) by 0 days.

(21) Appl. No.: 18/751,413

(22) Filed: Jun. 24, 2024

(30) Foreign Application Priority Data

Nov. 6, 2023 (CN) .......................... 202311467885.1

(51) Int. Cl.
*H01S 5/0687* (2006.01)
*H01S 3/13* (2006.01)
(Continued)

(52) U.S. Cl.
CPC .......... *H01S 5/0687* (2013.01); *H01S 3/1303* (2013.01); *H01S 3/1305* (2013.01);
(Continued)

(58) Field of Classification Search
CPC .... H01S 5/0687; H01S 3/1303; H01S 3/1305; H01S 5/0264; H01S 5/0612; H01S 5/06821
See application file for complete search history.

(56) References Cited

U.S. PATENT DOCUMENTS

2002/0041611 A1 * 4/2002 May ...................... H01S 5/0687
372/18

FOREIGN PATENT DOCUMENTS

CN          115102032 A  *  9/2022  ........... H01S 5/0014

OTHER PUBLICATIONS

Harbin Institute of Technology (Applicant), Preliminary amendment of CN202311467885.1, w/ replacement claims (allowed), Mar. 20, 2024.
(Continued)

*Primary Examiner* — Yuanda Zhang
(74) *Attorney, Agent, or Firm* — Hemisphere Law, PLLC; Zhigang Ma

(57) ABSTRACT

A frequency stabilization method and system for tunable light sources based on characteristic curve reconstruction are provided, which relate the field of frequency stabilization technologies of modulation absorption spectrum. A set of frequency stabilization control method and system based on internal modulation absorption spectroscopy of light source is constructed, and a high-precision laser frequency stabilization method under large-amplitude and high-bandwidth frequency modulation based on frequency discrimination curve reconstruction is proposed to solve a problem that it is difficult for micro-probe laser interferometry measurement benchmark to balance large-amplitude and high-bandwidth frequency modulation, and high-precision frequency stabilization, resulting in that it is difficult to obtain high relative accuracy measurement under large-range measurement. Under the large-amplitude and high-bandwidth frequency modulation, a distortion model of the frequency discrimination curve and a distortion correction model are constructed, which is used for feedback adjustment of phase compensation and reconstructing the frequency discrimination curve.

4 Claims, 1 Drawing Sheet

(51) Int. Cl.
   *H01S 5/026*  (2006.01)
   *H01S 5/06*   (2006.01)
   *H01S 5/068*  (2006.01)

(52) U.S. Cl.
   CPC .......... *H01S 5/0264* (2013.01); *H01S 5/0612* (2013.01); *H01S 5/06821* (2013.01)

(56) References Cited

OTHER PUBLICATIONS

CNIPA, Notification to grant patent right for invention in CN202311467885.1, Mar. 27, 2024.

\* cited by examiner

FREQUENCY STABILIZATION METHOD AND SYSTEM FOR TUNABLE LIGHT SOURCES BASED ON CHARACTERISTIC CURVE RECONSTRUCTION

CROSS-REFERENCE TO RELATED APPLICATION

This application claims priority to Chinese Patent Application No. 202311467885.1, filed on Nov. 6, 2023, which is herein incorporated by reference in its entirety.

TECHNICAL FIELD

The disclosure relates to the field of frequency stabilization technologies of modulation absorption spectrum, and more particularly to a frequency stabilization method and system for tunable light sources based on characteristic curve reconstruction.

BACKGROUND

As a core technology unit of ultra-precision laser measurement, a laser light source impacts accuracy and stability of the measurement. A micro-probe sensor type laser interferometer is a representative of the new generation of ultra-precision laser interferometric measurement instruments. Compared with the traditional laser interferometer, the micro-probe sensor type laser interferometer has significant advantages, such as a small probe size, easy installation and adjustment, isolation of thermal pollution, and easy embedded measurement realization. When using the micro-probe sensor type laser interferometer to perform high-speed and high-precision displacement measurement, a light source wavelength of the micro-probe sensor type laser interferometer requires large-range and high-bandwidth tuning. Meanwhile, stable of a center frequency (also refers to an output frequency) of the light source needs to be satisfied. A center output wavelength of the light source is used as a scale, thus, a study of center frequency stability under wavelength tuning is of utmost importance.

Wavelength stable of a semiconductor laser mainly relies on two technologies, one is a passive frequency stabilization technology, and the other is an active frequency stabilization technology. Passive frequency stabilization of a semiconductor laser diode is mainly achieved by improving driving current stability and temperature control stability of a driver, thereby improving wavelength output stability of the semiconductor laser diode. A core idea of the active frequency stabilization technology is to control an output wavelength of the laser within one standard and benchmark, and use a difference between a to-be-stabilized wavelength and a selected external benchmark as an error signal to achieve stable control of the laser. Generally, general external reference benchmarks mainly include two categories. One category is a laser with more stable and accurate wavelengths as a benchmark, but more precise lasers themselves are difficult to be achieved, therefore, the one category is difficult to be achieved. The other category is a standard Fabry-Perot (F-P) cavity or a gas atom absorption line as a reference standard.

FIG. 1 illustrates a schematic structural diagram of a typical internal modulation absorption spectrum frequency stabilization control system for a light source. A direct digital frequency synthesizer (DDS) 1 generates a sinusoidal signal to perform current modulation on a distributed feedback (DFB) laser 2, output light of the distributed feedback laser 2 is transmitted to a fiber optic isolator 3 through fiber optics, and then a fiber optic coupler 4 divides the output light into emergent light and signal light. The photodetector 6 converts the signal light passing through an acetylene absorption chamber 5 to an electrical signal, and the electrical signal passes through an analog-to-digital converter 7, a frequency stabilization control system 8 and a digital-to-analog converter 9 to obtain a controlling signal, to thereby adjust a driving current output by a driver 10. Ultimately, stable molecular absorption of the frequency of the laser light source under the large-range and high-bandwidth tuning is achieved.

In 2016, a team from Nagaoka University of Technology and Science in Japan conducted saturated absorption frequency stabilization method of iodine 2 (I2) ultrafine components near 633 nanometers (nm). This method greatly improves a maximum measurement speed upper limit of this type of laser interference measuring instrument. However, due to a small tuning range, it is difficult to satisfy large-scale displacement measurement of the laser interferometer.

In 2020, Institute of Semiconductor, Chinese Academy of Sciences has proposed a frequency stabilization system for a distributed feedback (DFB) laser diode based on a saturated absorption chamber. However, a modulation range is small and a modulation frequency is low, which leads to a poor dynamic measurement performance and a lower maximum measurement speed of a fiber optic micro-probe laser interferometer.

In summary, current research on center frequency stability of the laser light source tuned by the fiber micro-probe laser interferometer exists the following problems. A tuned center frequency stabilization technology based on molecular absorption frequency stabilization has a small tuning frequency and a small tuning range, which cannot satisfy requirements of measurement speed and measurement range precision of a micro-probe ultra-precision laser interferometer. Existing absorption frequency stabilization methods and models are only suitable for use under wavelength modulation of the light source with small-range and low-speed, a molecular absorption frequency stabilization model and method for large-range and high-bandwidth laser wavelength tuning in the fiber optic micro-probe laser interferometer are lacked, so that a fiber optic micro-probe interference light source cannot achieve center frequency stability or loses lock under the large-range high-bandwidth wavelength tuning, resulting in inaccurate measurement of the interferometer.

SUMMARY

In order to solve the above technical problems, the disclosure provides a frequency stabilization method and system for tunable light sources based on characteristic curve reconstruction, to solve the problems in the related art, and technical solutions adopted by the disclosure are as follows.

A frequency stabilization method for tunable light sources based on characteristic curve reconstruction is provided, and the frequency stabilization method includes:

step 1, outputting, by a laser (i.e., a tunable light source), laser to a fiber optic coupler, and dividing, by the fiber optic coupler, the laser into two laser beams, where one of the two laser beams is configured to be emergent light, the other of the two laser beams is configured to be signal light to be input into an acetylene absorption chamber and a photodetector; converting, by the photodetector, the signal light to an electrical signal and inputting the electrical signal into an analog-to-digital converter, converting, by the analog-to-digital converter, the electrical signal to a light intensity signal, and inputting the light intensity signal into a frequency stabilization control system;

step 2, adjusting, by changing a driving temperature of the laser, an output wavelength of the laser to be approximate to a target absorption peak of acetylene gas, multiplying, by a multiplier, the light intensity signal with a carrier signal to obtain a multiplied signal, inputting the multiplied signal into a low-pass filter to obtain a coarse frequency discrimination signal H*(v), and calculating, by a peak detection unit, a coarse peak value MAX* and a coarse valley value MIN* of the coarse frequency discrimination signal H*(v), and a coarse sum value D* and a coarse difference value G* of the coarse peak value MAX* and the coarse valley value MIN* of the coarse frequency discrimination signal H*(v);

step 3, adjusting, by a phase compensation unit, a carrier phase to be compensated $\alpha^*$ of the carrier signal with a step size of 30°, performing a process of multiplying, by a multiplier, the light intensity signal with a carrier signal to obtain a multiplied signal, inputting the multiplied signal into a low-pass filter to obtain a coarse frequency discrimination signal H*(v), and calculating, by a peak detection unit, a coarse peak value MAX* and a coarse valley value MIN* of the coarse frequency discrimination signal H*(v), and a coarse sum value D* and a coarse difference value G* of the coarse peak value MAX* and the coarse valley value MIN* of the coarse frequency discrimination signal H*(v) in the step 2 for multiple times to obtain multiple coarse difference values G* fitting the multiple coarse difference values G* to obtain a maximum coarse difference value, to thereby obtain a coarse carrier compensation phase $\alpha_0$ corresponding to the maximum coarse difference value;

adjusting, by using the coarse carrier compensation phase $\alpha_0$ as an adjustment center, the carrier phase to be compensated $\alpha^*$ of the carrier signal with a step size of 5° within a range of 15° before and after the coarse carrier compensation phase $\alpha_0$, performing the process of multiplying, by a multiplier, the light intensity signal with a carrier signal to obtain a multiplied signal, inputting the multiplied signal into a low-pass filter to obtain a coarse frequency discrimination signal H*(v), and calculating, by a peak detection unit, a coarse peak value MAX* and a coarse valley value MIN* of the coarse frequency discrimination signal H*(v), and a coarse sum value D* and a coarse difference value G* of the coarse peak value MAX* and the coarse valley value MIN* of the coarse frequency discrimination signal H*(v) in the step 2 for multiple times to obtain a fine carrier compensation phase $\alpha$, a corresponding fine sum value D and a corresponding maximum fine difference value $G_{max}$ thereof;

step 4, multiplying, by a frequency locking point calculation unit, the fine sum value D obtained in the step 3 with a scale factor k to obtain a reset frequency locking point $H\oplus(v_0)$; and step 5, outputting, by a proportional integral (PI) controller, a controlling signal according to an error result obtained after obtaining the reset frequency locking point $H\oplus(v_0)$, wherein the controlling signal is configured to adjust a driving current and the driving temperature of the laser, to thereby stabilize an output frequency of the laser at a target frequency locking point.

A frequency stabilization system for tunable light sources based on characteristic curve reconstruction is provided, and the frequency stabilization system includes: a direct digital frequency synthesizer, a laser, a fiber optic isolator, a fiber optic coupler, an acetylene absorption chamber, a photodetector, an analog-to-digital converter, a frequency stabilization control system, a digital-to-analog converter and a driver sequentially connected in that order. An output end of the driver is connected to the laser. The direct digital frequency synthesizer is configured to generate a sinusoidal signal to perform current modulation on the laser. The laser is configured to generate the laser to be input into the fiber optic isolator through fiber optics. The fiber optic coupler is configured to divide the laser into emergent light and signal light. The photodetector is configured to convert the signal light passing through the acetylene absorption chamber to an electrical signal, and the electrical signal is configured to pass through the analog-to-digital converter, the frequency stabilization control system and the digital-to-analog converter to obtain a controlling signal, to thereby adjust a driving current output from the driver to the laser.

A frequency stabilization system is provided, which includes: a peak detection unit, a phase compensation unit and a frequency locking point calculation unit. The phase compensation unit is configured to calculate a frequency discrimination signal. The peak detection unit is configured to calculate a peak value and a valley value of the frequency discrimination signal. The frequency locking point calculating unit is configured to calculate a reset frequency locking point.

In an embodiment, each of the peak detection unit, the phase compensation unit and the frequency locking point calculation unit are embodied by software stored in at least one memory and executable by at least one processor coupled with the at least one memory. For example, the at least processor includes a field programmable gate array (FPGA) chip.

The disclosure has the following beneficial effects. In order to solve a problem that it is difficult for micro-probe laser interferometry measurement benchmark to balance large-amplitude and high-bandwidth frequency modulation, and high-precision frequency stabilization, resulting in that it is difficult to obtain high relative accuracy measurement under a large-range measurement, the disclosure proposes a high-precision laser frequency stabilization method under the large-amplitude and high-bandwidth frequency modulation based on frequency discrimination curve reconstruction. Under the large-amplitude and high-bandwidth frequency modulation, a distortion model of the frequency discrimination curve and a distortion correction model are constructed, the distortion correction model is used for feedback adjustment of phase compensation and reconstructing the frequency discrimination characteristic curve, and a corresponding relationship between the frequency locking point and a frequency stabilization benchmark is identified, so as to achieve locking and tracking of gas molecule absorption benchmarks, and accurately control the center frequency of large-range and high-bandwidth tuning.

DETAILED DESCRIPTION OF EMBODIMENTS

Figure 1:
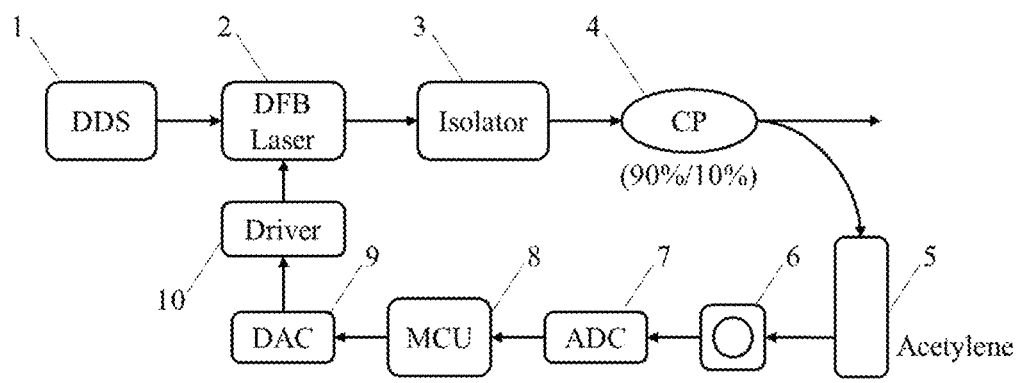
FIG. 1 illustrates a schematic structural diagram of a frequency stabilization system for tunable light sources based on characteristic curve reconstruction according to an embodiment of the disclosure.

Technical solutions in embodiments of the disclosure are clearly and completely described in conjunction with FIG. 1 and FIG. 2 in the embodiments of the disclosure below. Apparently, the described embodiments are merely some of the embodiments of the disclosure, not all of them. Unless specifically specified, technical means used in the embodiments are conventional means well-known to those skilled in the art.

The disclosure constructs a set of frequency stabilization control method and system based on internal modulation absorption spectroscopy of a light source, and proposes a high-precision laser frequency stabilization method under large-amplitude and high-bandwidth frequency modulation based on frequency discrimination curve reconstruction to solve a problem that it is difficult for micro-probe laser interferometry measurement benchmark to balance large-amplitude and high-bandwidth frequency modulation, and high-precision frequency stabilization, resulting in that it is difficult to obtain high relative accuracy measurement under a large-range measurement. Under the large-amplitude and high-bandwidth frequency modulation, a distortion model of the frequency discrimination curve and a distortion correction model are constructed. The distortion correction model is used for feedback adjustment of phase compensation and reconstructing the frequency discrimination curve, and a corresponding relationship between the frequency locking point and a frequency stabilization benchmark is identified, so as to achieve locking and tracking of gas molecule absorption benchmarks, and accurately control the center frequency of large-range and high-bandwidth tuning.

A frequency stabilization method for tunable light sources based on characteristic curve reconstruction is provided, and the frequency stabilization method includes the following steps 1-5.

In step 1, laser is output to a fiber optic coupler 4 by a laser 2, and the laser is divided into two laser beams by the fiber optic coupler 4. One laser beam is used as emergent light, and the other laser beam is used as signal light to be input into an acetylene absorption chamber 5 and a photodetector 6. The signal light is converted to an electrical signal by the photodetector 6, and the electrical light is input into an analog-to-digital converter 7. The electrical signal is converted to a light intensity signal by the analog-to-digital converter 7. The light intensity signal is input into a frequency stabilization control system 8.

In step 2, an output wavelength of the laser is adjusted to be approximate to a target absorption peak of acetylene gas by changing a driving temperature of the laser 2. The light intensity signal is multiplied with a carrier signal to obtain a multiplied signal by a multiplier 11.

The multiplied signal is input into a low-pass filter 12 to obtain a coarse frequency discrimination signal $H^*(v)$. A coarse peak value MAX* and a coarse valley value MIN* of the coarse frequency discrimination signal $H^*(v)$, and a coarse sum value D* and a coarse difference value G* of the coarse peak value MAX* and the coarse valley value MIN* of the coarse frequency discrimination signal $H^*(v)$ are calculated by a peak detection unit 13.

In step 3, a carrier phase to be compensated $\alpha^*$ of the carrier signal is adjusted b a phase compensation unit 14 with a step size of 30°, and a process of multiplying, by a multiplier, the light intensity signal with a carrier signal to obtain a multiplied signal, inputting the multiplied signal into a low-pass filter to obtain a coarse frequency discrimination signal $H^*(v)$, and calculating, by a peak detection unit, a coarse peak value MAX* and a coarse valley value MIN* of the coarse frequency discrimination signal $H^*(v)$, and a coarse sum value D* and a coarse difference value G* of the coarse peak value MAX* and the coarse valley value MIN* of the coarse frequency discrimination signal $H^*(v)$ in the step 2 is performed for multiple times to obtain multiple coarse difference values G*. The multiple coarse difference values G* are fitted to obtain a maximum coarse difference value, to thereby obtain a coarse carrier compensation phase $\alpha_0$ corresponding to the maximum coarse difference value. The carrier phase to be compensated $\alpha^*$ of the carrier signal is adjusted by using the coarse carrier compensation phase $\alpha_0$ as an adjustment center with a step size of 5° within a range of 15° before and after the coarse carrier compensation phase $\alpha_0$, and the process of multiplying, by a multiplier, the light intensity signal with a carrier signal to obtain a multiplied signal, inputting the multiplied signal into a low-pass filter to obtain a coarse frequency discrimination signal $H^*(v)$, and calculating, by a peak detection unit, a coarse peak value MAX* and a coarse valley value MIN* of the coarse frequency discrimination signal $H^*(v)$, and a coarse sum value D* and a coarse difference value G* of the coarse peak value MAX* and the coarse valley value MIN* of the coarse frequency discrimination signal $H^*(v)$ in the step 2 is performed for multiple times to obtain a fine carrier compensation phase $\alpha$, a corresponding fine sum value D and a corresponding maximum fine difference value $G_{max}$ thereof.

In step 4, the fine sum value D obtained in the step 3 is multiplied with a scale factor k to obtain a reset frequency locking point $H\oplus(v_0)$ by a frequency locking point calculation unit 15.

In step 5, a controlling signal (U) is output by a PI controller 17 according to an error result obtained after obtaining the reset frequency locking point $H\oplus(v_0)$, and the controlling signal is configured to adjust a driving current and the driving temperature of the laser 2, to thereby stabilize an output frequency of the laser 2 at a target frequency locking point.

In an embodiment, in the step 1, a modulated output frequency of the laser 2 is expressed as $v_m = v + \Delta v_m \cos(\omega_0 t)$. The light intensity signal is expressed as $I[v + \Delta v_m \cos(\omega_0 t)]$, and a Taylor formula is used to expand the light intensity signal at the output frequency $v$ and combine similar terms as follows:

$$I[v + \Delta v_m \cos(\omega_0 t)] = I(v) + \Delta v_m \cos(\omega_0 t) \frac{\partial I}{\partial v} + \frac{\Delta v_m^2}{2!} \cos^2(\omega_0 t) \frac{\partial^2 I}{\partial v^2} +$$
$$\frac{\Delta v_m^3}{3!} \cos^3(\omega_0 t) \frac{\partial^3 I}{\partial v^3} + \frac{\Delta v_m^4}{4!} \cos^4(\omega_0 t) \frac{\partial^4 I}{\partial v^4} + \ldots$$
$$= \left[ I(V) + \frac{\Delta v_m^2}{4} \frac{\partial^2 I}{\partial v^2} + \frac{\Delta v_m^4}{64} \frac{\partial^4 I}{\partial v^4} + \ldots \right] +$$
$$\cos(\omega_0 t) \left[ \Delta v_m \frac{\partial I}{\partial v} + \frac{\Delta v_m^3}{8} \frac{\partial^3 I}{\partial v^3} + \ldots \right] +$$
$$\cos(2\omega_0 t) \left[ \frac{\Delta v_m^2}{4} \frac{\partial^2 I}{\partial v^2} + \frac{\Delta v_m^2}{48} \frac{\partial^4 I}{\partial v^4} + \ldots \right] +$$
$$\cos(3\omega_0 t) \left[ \frac{\Delta v_m^3}{24} \frac{\partial^3 I}{\partial v^3} + \frac{\Delta v_m^5}{384} \frac{\partial^5 I}{\partial v^5} + \ldots \right]$$

where $\Delta v_m$ represents a modulation frequency range and $\omega_0$ represents a modulation frequency.

Therefore, the coarse frequency discrimination signal $H^*(v)$ obtained by multiplying the light intensity signal with the carrier signal to be compensated $\cos(\omega_0 t - \alpha^*)$ after phase adjustment is expressed as follows:

$$H^*(v) = LPF[I[v + \Delta v_m \cos(\omega_0 t)] \cdot \cos(\omega_0 t) - \alpha^*)]$$
$$\approx \cos(\varphi_c - \alpha^*) \times \Delta v_m \frac{\partial I}{\partial v} + m\cos(\varphi_m + \varphi_c - \alpha^*) \times I(v)$$
$$= \cos(\varphi_c - \alpha^*) \times \Delta v_m \times \frac{2a\gamma^2(v - v_0)}{[\gamma^2 + (v - v_0)^2]^2} +$$
$$m\cos(\varphi_m + \varphi_c - \alpha^*) \times \left( 1 - \frac{a\gamma^2}{\gamma^2 + (v - v_0)^2} \right)$$
$$= H_o^*(v) + H_e^*(v)$$

where $\alpha^*$ represents the carrier phase to be compensated. After expanding the coarse frequency discrimination signal $H^*(v)$, the coarse frequency discrimination signal includes a coarse odd function term $H_o^*(v)$ and a coarse even function term $H_e^*(v)$ with a center of $$v = v_0 \cdot \frac{\partial I}{\partial v}$$

represents a first derivative of the light intensity signal I with respect to the output frequency $v$ of the laser 2, $v_0$ represents a traceable frequency corresponding to the target absorption peak of the acetylene gas, and $\alpha$ represents the fine carrier compensation phase.

In an embodiment, in the step 2 and step 3, in order to achieve a carrier signal phase compensation function, the peak detection (i.e., a step of multiplying, by a multiplier (11), the light intensity signal with a carrier signal to obtain a multiplied signal, inputting the multiplied signal into a low-pass filter (12) to obtain a coarse frequency discrimination signal $H^*(v)$, calculating, by a peak detection unit 13, a coarse peak value MAX* and a coarse valley value MIN* of the coarse frequency discrimination signal $H^*(v)$, and a coarse sum value D* and a coarse difference value G* of the coarse peak value MAX* and the coarse valley value MIN* of the coarse frequency discrimination signal $H^*(v)$) needs to be performed for multiple times to iterate the coarse frequency discrimination signal $H^*(v)$. According to an odd function characteristic of the coarse frequency discrimination signal $H^*(v)$, the coarse peak value MAX* and the coarse valley value MIN* of the coarse frequency discrimination signal $H^*(v)$ are calculated by solving two zero frequencies $v_1$ and $v_2$ of a first derivative of the coarse odd function term $H_o^*(v)$ in the peak detection unit 13. Formulas of the coarse peak value MAX* and the coarse valley value MIN* are expressed as follows:

$$\text{MAX}^* =$$
$$H^*(v_1) = \cos(\varphi_c - \alpha^*) \times \Delta v_m \times \frac{3\sqrt{3}\,a}{8\gamma} + m\cos(\varphi_m + \varphi_c - \alpha^*) \times \left(1 - \frac{3a}{4}\right);$$

and $$\text{MIN}^* =$$
$$H^*(v_2) = \cos(\varphi_c - \alpha^*) \times \Delta v_m \times \left(-\frac{3\sqrt{3}\,a}{8\gamma}\right) + m\cos(\varphi_m + \varphi_c - \alpha^*) \times \left(1 - \frac{3a}{4}\right);$$

where $\varphi_c$ represents a phase delay between a frequency modulation signal of laser and the carrier signal due to optical path delay, the frequency modulation signal of laser and the carrier signal have a same frequency, m represents an adjoint light intensity modulation coefficient, $\varphi_m$ represents a phase difference between laser frequency modulation and light source power modulation due to adjoint light intensity, $\alpha$ represents an absorption rate of the target absorption peak of the acetylene gas, and $\gamma$ represents a half width (i.e., full width at half maximum, FWHM) of an absorption spectral line of the target absorption peak of the acetylene gas.

The coarse sum value D* and the coarse difference value G* of the coarse peak value MAX* and the coarse valley value MIN* of the coarse frequency discrimination signal $H^*(v)$ are solved through the following formulas:

$$G^* = \text{MAX}^* - \text{MIN}^* = H^*(v_1) - H^*(v_2) = \cos(\varphi_c - \alpha^*) \times \Delta v_m \times \left(\frac{3\sqrt{3}\,a}{4\gamma}\right);$$

and $$D^* = \text{MAX}^* + \text{MIN}^* = H^*(v_1) + H^*(v_2) = m\cos(\varphi_m + \varphi_c - \alpha^*) \times \left(2 - \frac{3a}{2}\right).$$

A target phase step size is set to satisfy a target precision requirement, the peak detection is repeated to iterate the coarse frequency discrimination signal $H^*(v)$, to thereby obtain the maximum fine difference value $G_{max}$ and the corresponding fine carrier compensation phase $\alpha$ thereof.

In an embodiment, in the step 4, the traceable frequency $v_0$ is substituted into $H^*(v)$ through the frequency locking point calculation unit (15) to obtain a relationship formula between the reset frequency locking point $H\oplus(v_0)$ and the fine sum value D, and the relationship formula is expressed as follows:

$$H^\oplus(v_0) = m\cos(\varphi_m + \varphi_c - \alpha) \times (1 - a) = D\!\left/\!\left(2 - \frac{3a}{2}\right)\right. \times (1 - a) = D/k;$$

where k represents the scale factor, and the reset frequency locking point is obtained through the fine sum value D and the scale factor k.

The disclosure further provides a frequency stabilization system for tunable light sources based on characteristic curve reconstruction, which includes: a direct digital frequency synthesizer (DDS) 1, a laser 2, a fiber optic isolator 3, a fiber optic coupler 4, an acetylene absorption chamber 5, a photodetector 6, an analog-to-digital converter (ADC) 7, a frequency stabilization control system (MCU) 8, a digital-to-analog converter (DAC) 9 and a driver 10 sequentially connected in that order. An output end of the driver 10 is connected to the laser 2.

The disclosure further provides the frequency stabilization control system, which includes a multiplier 11, a low-pass filter (LPF) 12, a peak detection (PAD) unit 13, a phase compensation unit 14, a frequency locking point calculation (FLPC) unit 15, a comparer (ECU) 16 and a PI controller 17. The peak detection unit 13 is configured to calculate the peak value and the valley value of the obtained frequency discrimination signal. The frequency locking point calculation unit 15 is configured to reset the frequency locking point.

Specifically, the multiplier 11 is configured to calculate the multiplied value of the light intensity signal with the carrier signal. The low-pass filter 12 is configured to obtain a multiplied value after low-pass filtering (i.e., the frequency discrimination signal). The comparer 16 is configured to calculate a difference (i.e., the error result) between an actual frequency discrimination signal and a frequency discrimination signal after completing characteristic curve reconstruction. The PI controller 17 is configured to generate a controlling signal for changing the driving current and the driving temperature of the laser 2, to thereby achieve frequency stabilization.

A specific work process of the disclosure is as follows.

Figure 2:
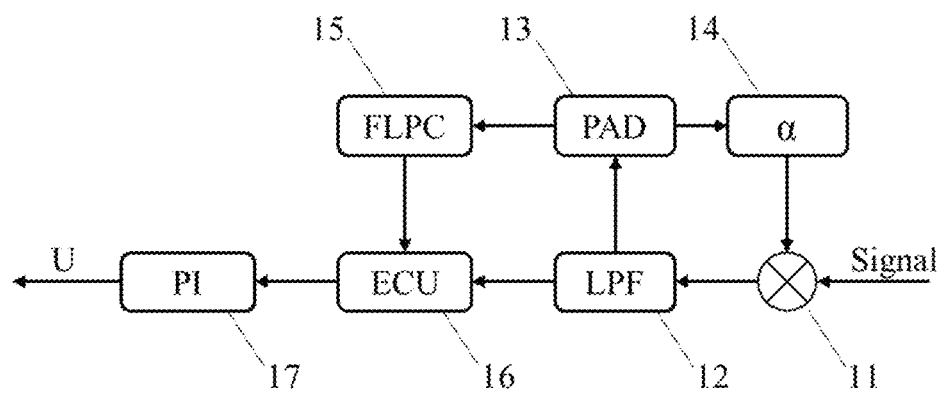
FIG. 2 illustrates a schematic internal diagram of a frequency stabilization control system of the frequency stabilization system for tunable light sources based on characteristic curve reconstruction according to an embodiment of the disclosure.

As shown in FIG. 1, the direct digital frequency synthesizer 1 generates a sinusoidal signal to perform current modulation on the laser 2, output light (i.e., the laser) of the laser 2 is transmitted to the fiber optic isolator 3 through fiber optics, and then the fiber optic coupler 4 divides the output light of the laser 2 into the emergent light and the signal light. The photodetector 6 converts the signal light passing through the acetylene absorption chamber 5 to the electrical signal. The electrical signal passes through the analog-to-digital converter 7, the frequency stabilization control system 8 and the digital-to-analog converter 9 to obtain a controlling signal, to thereby adjust the driving current output by the driver 10. Ultimately, stable molecular absorption of the frequency of the laser light source under the large-range and high-bandwidth tuning is achieved. Currently, a compensated frequency discrimination signal obtained by multiplying the modulated light intensity signal with the carrier signal after passing through the phase compensation unit 14 is expressed as follows:

$$H^{\oplus}(v) = LPF[I[v + \Delta v_m \cos(\omega_0 t)] \cdot \cos(\omega_0 t - \alpha)]$$
$$\approx \cos(\varphi_c - \alpha) \times \Delta v_m \frac{\partial I}{\partial v} + m\cos(\varphi_m + \varphi_c - \alpha) \times I(v)$$
$$= \cos(\varphi_c - \alpha) \times \Delta v_m \times \frac{2a\gamma^2(v - v_0)}{[\gamma^2 + (v - v_0)^2]^2} +$$
$$m\cos(\varphi_m + \varphi_c - \alpha) \times \left(1 \frac{a\gamma^2}{\gamma^2 + (v - v_0)^2}\right)$$

where $\alpha$ represents the fine carrier compensation phase. The first term is an odd function centered on an axis $v = v_0$, and the second term is an even function centered on the axis $v = v_0$.

Therefore, two zero frequencies $v_1$ and $v_2$ of the first term are obtained by using function derivation in the peak detection unit 13, thus obtaining a peak value MAX and a valley value MIN of the compensated frequency discrimination signal expressed as follows:

$$MAX =$$
$$H^{\oplus}(v_1) = \cos(\varphi_c - \alpha) \times \Delta v_m \times \frac{3\sqrt{3}\,a}{8\gamma} + m\cos(\varphi_m + \varphi_c - \alpha) \times \left(1 - \frac{3a}{4}\right);$$

and $$MIN =$$
$$H^{\oplus}(v_2) = \cos(\varphi_c - \alpha^*) \times \Delta v_m \times \left(-\frac{3\sqrt{3}\,a}{8\gamma}\right) + m\cos(\varphi_m + \varphi_c - \alpha) \times \left(1 - \frac{3a}{4}\right).$$

A difference value G and a sum value D of the peak value MAX and the valley value MIN are obtained, and formulas of the difference value G and the sum value D are expressed as follows:

$$G = MAX - MIN = H^{\oplus}(v_1) - H^{\oplus}(v_2) = \cos(\varphi_c - \alpha) \times \Delta v_m \times \left(\frac{3\sqrt{3}\,a}{4\gamma}\right);$$

and $$D^* = MAX + MIN = H^{\oplus}(v_1) + H^{\oplus}(v_2) = m\cos(\varphi_m + \varphi_c - \alpha) \times \left(2 - \frac{3a}{2}\right).$$

After the peak value MAX, the valley value MIN, the difference value G and the sum value D of the peak value MAX and the valley value MIN are input into the phase compensation unit 14, The carrier phase to be compensated $\alpha^*$ of the carrier signal is adjusted with a step size of 30°, the peak detection is performed for multiple times to obtain the G values (i.e., the difference values). The G values are compared to obtain a maximum G value (i.e., the maximum difference value), to thereby obtain an additional carrier compensation phase $\alpha_0$ (i.e., the coarse carrier compensation phase) corresponding to the maximum G value. The additional carrier compensation phase $\alpha_0$ is used as an adjustment center to adjust the carrier phase to be compensated $\alpha^*$ of the carrier signal with a step size of 5° within a range of 15° before and after the additional carrier compensation phase $\alpha_0$. The peak detection is performed for multiple times to obtain a relatively accurate phase delay compensation value $\alpha$ (i.e., the fine coarse compensation phase). When higher accuracy is required, a smaller compensation phase step size is required.

A D value corresponding to the phase delay compensation value α is input into the frequency locking point calculation unit 15, a traceable frequency $v_0$ is substituted into the H*(v) to obtain a relationship formula between the reset frequency locking point H⊕($v_0$) and the D value, and the relationship formula is expressed as follows:

$$H^\oplus(v_0) = m\cos(\varphi_m + \varphi_c - \alpha) \times (1-a) = D/\left(2 - \frac{3a}{2}\right) \times (1-a).$$

In the relationship formula, a represents an absorption rate of the target absorption peak of the acetylene gas, and it can be obtained by searching for information of the selected acetylene chamber. Therefore, reset of the frequency locking point is achieved.

After analyzing test results of laser stabilization for many times in different time periods and optimizing the frequency stabilization system, a relative amount of fluctuation of the center frequency of the laser 2 is 2.5×10-8, that is, a relative accuracy of the center frequency is 5×10-8k=2, which indicates efficiency of the optimal frequency stabilization system proposed by the disclosure. A modulated signal amplitude is further changed to further adjust a modulated amplitude and test a wavelength stability. A test time after adjusting is 20 minutes (min) for each time, a modulation bandwidth is 1 megahertz (MHz) for each time. The final conclusion is that in a range of the modulation bandwidth of 1 MHz and the modulation amplitude of 150 MHz-2.61 gigahertz (GHz), the stability of the high-speed tuning frequency stabilization light source studied in the disclosure is not affected by modulation width changes, and the frequency stabilization control accuracy is on the order of 5×10–8k=2. No impact of modulation amplitude changes on the system frequency stabilization accuracy was found under this frequency stabilization method, supporting the laser interferometer to maintain high relative accuracy in large-scale measurements.

The above described embodiments are merely a description of some of the embodiments of the disclosure, and are not a limitation of a scope of the disclosure. Without departing from a design spirit of the disclosure, all variations, modifications, and replacements made by those skilled in the art to the technical solutions of the disclosure should fall within the scope of protection determined in claims of the disclosure.

What is claimed is:

1. A frequency stabilization method for tunable light sources based on characteristic curve reconstruction, comprising:

step 1, outputting, by a laser (2), laser to a fiber optic coupler (4), and dividing, by the fiber optic coupler (4), the laser into two laser beams, wherein one of the two laser beams is configured to be emergent light, the other of the two laser beams is configured to be signal light to be input into an acetylene absorption chamber (5) and a photodetector (6); converting, by the photodetector (6), the signal light to an electrical signal and inputting the electrical signal into an analog-to-digital converter (7), converting, by the analog-to-digital converter (7), the electrical signal to a light intensity signal, and inputting the light intensity signal into a frequency stabilization control system (8);

step 2, adjusting, by changing a driving temperature of the laser (2), an output wavelength of the laser to be approximate to a target absorption peak of acetylene gas, multiplying, by a multiplier (11), the light intensity signal with a carrier signal to obtain a multiplied signal, inputting the multiplied signal into a low-pass filter (12) to obtain a coarse frequency discrimination signal H*(v), and calculating, by a peak detection unit (13), a coarse peak value MAX* and a coarse valley value MIN* of the coarse frequency discrimination signal H*(v), and a coarse sum value D* and a coarse difference value G* of the coarse peak value MAX* and the coarse valley value MIN* of the coarse frequency discrimination signal H*(v);

step 3, adjusting, by a phase compensation unit (14), a carrier phase to be compensated α* of the carrier signal with a step size of 30°, performing a process of multiplying, by a multiplier (11), the light intensity signal with a carrier signal to obtain a multiplied signal, inputting the multiplied signal into a low-pass filter (12) to obtain a coarse frequency discrimination signal H*(v), and calculating, by a peak detection unit (13), a coarse peak value MAX* and a coarse valley value MIN* of the coarse frequency discrimination signal H*(v), and a coarse sum value D* and a coarse difference value G* of the coarse peak value MAX* and the coarse valley value MIN* of the coarse frequency discrimination signal H*(v) in the step 2 for a plurality of times to obtain a plurality of coarse difference values G*, fitting the plurality of coarse difference values G* to obtain a maximum coarse difference value, to thereby obtain a coarse carrier compensation phase $α_0$ corresponding to the maximum coarse difference value; and adjusting, by using the coarse carrier compensation phase $α_0$ as an adjustment center, the carrier phase to be compensated α* of the carrier signal with a step size of 5° within a range of 15° before and after the coarse carrier compensation phase $α_0$, performing the process of multiplying, by a multiplier (11), the light intensity signal with a carrier signal to obtain a multiplied signal, inputting the multiplied signal into a low-pass filter (12) to obtain a coarse frequency discrimination signal H*(v), and calculating, by a peak detection unit (13), a coarse peak value MAX* and a coarse valley value MIN* of the coarse frequency discrimination signal H*(v), and a coarse sum value D* and a coarse difference value G* of the coarse peak value MAX* and the coarse valley value MIN* of the coarse frequency discrimination signal H*(v) in the step 2 for a plurality of times to obtain a fine carrier compensation phase α, a corresponding fine sum value D and a corresponding maximum fine difference value $G_{max}$ thereof;

step 4, multiplying, by a frequency locking point calculation unit (15), the fine sum value D obtained in the step 3 with a scale factor k to obtain a reset frequency locking point H⊕($v_0$); and step 5, outputting, by a proportional integral (PI) controller (17), a controlling signal according to an error result obtained after obtaining the reset frequency locking point H⊕($v_0$), wherein the controlling signal is configured to adjust a driving current and the driving temperature of the laser (2), to thereby stabilize an output frequency of the laser (2) at a target frequency locking point;

wherein in the step 1, a modulated output frequency of the laser (2) is expressed as $v_m = v + \Delta v_m \cos(\omega_0 t)$, and the light intensity signal is expressed as $I[v + \Delta v_m \cos(\omega_0 t)]$, and a Taylor formula is used to expand the light intensity signal at the output frequency $v$ of the laser (2) and combine similar terms, which is expressed as follows:

$$I[v + \Delta v_m \cos(\omega_0 t)] = I(v) + \Delta v_m \cos(\omega_0 t) \frac{\partial I}{\partial v} + \frac{\Delta v_m^2}{2!} \cos^2(\omega_0 t) \frac{\partial^2 I}{\partial v^2} +$$
$$\frac{\Delta v_m^3}{3!} \cos^3(\omega_0 t) \frac{\partial^3 I}{\partial v^3} + \frac{\Delta v_m^4}{4!} \cos^4(\omega_0 t) \frac{\partial^4 I}{\partial v^4} + \ldots$$
$$= \left[ I(V) + \frac{\Delta v_m^2}{4} \frac{\partial^2 I}{\partial v^2} + \frac{\Delta v_m^4}{64} \frac{\partial^4 I}{\partial v^4} + \ldots \right] +$$
$$\cos(\omega_0 t) \left[ \Delta v_m \frac{\partial I}{\partial v} + \frac{\Delta v_m^3}{8} \frac{\partial^3 I}{\partial v^3} + \ldots \right] +$$
$$\cos(2\omega_0 t) \left[ \frac{\Delta v_m^2}{4} \frac{\partial^2 I}{\partial v^2} + \frac{\Delta v_m^4}{48} \frac{\partial^4 I}{\partial v^4} + \ldots \right] +$$
$$\cos(3\omega_0 t) \left[ \frac{\Delta v_m^3}{24} \frac{\partial^3 I}{\partial v^3} + \frac{\Delta v_m^5}{384} \frac{\partial^5 I}{\partial v^5} + \ldots \right]$$

wherein $\Delta v_m$ represents a modulation frequency range, t represents a time variable, and $\omega_0$ represents a modulation frequency; and the coarse frequency discrimination signal H*($v$) obtained by multiplying the light intensity signal with a carrier signal to be compensated $\cos(\omega_0 t - \alpha^*)$ after phase adjustment is expressed as follows:

$$H^*(v) = LPF[I[v + \Delta v_m \cos(\omega_0 t)] \cdot \cos(\omega_0 t) - \alpha^*)]$$
$$\approx \cos(\varphi_c - \alpha^*) \times \Delta v_m \frac{\partial I}{\partial v} + m \cos(\varphi_m + \varphi_c - \alpha^*) \times I(v)$$
$$= \cos(\varphi_c - \alpha^*) \times \Delta v_m \times \frac{2a\gamma^2(v - v_0)}{[\gamma^2 + (v - v_0)^2]^2} +$$
$$m \cos(\varphi_m + \varphi_c - \alpha^*) \times \left( 1 - \frac{a\gamma^2}{\gamma^2 + (v - v_0)^2} \right)$$
$$= H_o^*(v) + H_e^*(v)$$

wherein $\alpha^*$ represents the carrier phase to be compensated; after expanding the coarse frequency discrimination signal H*($v$), the coarse frequency discrimination signal comprises a coarse odd function term $H_o^*(v)$ and a coarse even function term $H_e^*(v)$ with a center of $$v = v_0; \text{ and } \frac{\partial I}{\partial v}$$

represents a first derivative of the light intensity signal I with respect to the output frequency $v$ of the laser (2), $v_0$ represents a traceable frequency corresponding to the target absorption peak of the acetylene gas, a represents an absorption rate of the target absorption peak of the acetylene gas, $\gamma$ represents a half width of an absorption spectral line of the target absorption peak of the acetylene gas, $\varphi_c$ represents a phase delay between a frequency modulation signal of laser and the carrier signal due to optical path delay, the frequency modulation signal of laser and the carrier signal have a same frequency, m represents an adjoint light intensity modulation (AOIM) coefficient, $\varphi_m$ represents a phase difference between laser frequency modulation and light source power modulation due to adjoint light intensity, and a represents the fine carrier compensation phase.

2. The frequency stabilization method for tunable light sources based on characteristic curve reconstruction as claimed in claim 1, wherein in the step 2 and the step 3, a step of the calculating, by a peak detection unit (13), a coarse peak value MAX* and a coarse valley value MIN* of the coarse frequency discrimination signal H*($v$), and a coarse sum value D* and a coarse difference value G* of the coarse peak value MAX* and the coarse valley value MIN* of the coarse frequency discrimination signal H*($v$) is performed for a plurality of times to iterate the coarse frequency discrimination signal H*($v$), to thereby achieve a carrier signal phase compensation function of the carrier signal; and the step of the calculating, by a peak detection unit (13), a coarse peak value MAX* and a coarse valley value MIN* of the coarse frequency discrimination signal H*($v$), and a coarse sum value D* and a coarse difference value G* of the coarse peak value MAX* and the coarse valley value MIN* of the coarse frequency discrimination signal H*($v$) specifically comprises:

calculating, according to an odd function characteristic of the coarse frequency discrimination signal H*($v$) and by solving two zero frequencies $v_1$ and $v_2$ of a first derivative of the coarse odd function term $H_o^*(v)$, the coarse peak value MAX* and the coarse valley value MIN* of the coarse frequency discrimination signal H*($v$) by the peak detection unit (13), and formulas of the coarse peak value MAX* and the coarse valley value MIN* are expressed as follows:

$$\text{MAX}^* =$$
$$H^*(v_1) = \cos(\varphi_c - \alpha^*) \times \Delta v_m \times \frac{3\sqrt{3}\,a}{8\gamma} + m\cos(\varphi_m + \varphi_c - \alpha^*) \times \left(1 - \frac{3a}{4}\right);$$

and $$\text{MIN}^* =$$
$$H^*(v_2) = \cos(\varphi_c - \alpha^*) \times \Delta v_m \times \left(-\frac{3\sqrt{3}\,a}{8\gamma}\right) + m\cos(\varphi_m + \varphi_c - \alpha^*) \times \left(1 - \frac{3a}{4}\right);$$

solving the coarse sum value D* and the coarse difference value G* of the coarse peak value MAX* and the coarse valley value MIN* of the coarse frequency discrimination signal H*($v$) through the following formulas:

$$G^* = \text{MAX}^* - \text{MIN}^* = H^*(v_1) - H^*(v_2) = \cos(\varphi_c - \alpha^*) \times \Delta v_m \times \left(\frac{3\sqrt{3}\,a}{4\gamma}\right);$$

and $$D^* = \text{MAX}^* + \text{MIN}^* = H^*(v_1) + H^*(v_2) = m\cos(\varphi_m + \varphi_c - \alpha^*) \times \left(2 - \frac{3a}{2}\right);$$

setting a target phase step size to satisfy a target precision requirement, repeating the step of the calculating, by a peak detection unit (13), a coarse peak value MAX* and a coarse valley value MIN* of the coarse frequency discrimination signal H*(v), and a coarse sum value D* and a coarse difference value G* of the coarse peak value MAX* and the coarse valley value MIN* of the coarse frequency discrimination signal H*(v) to iterate the coarse frequency discrimination signal H*(v), to thereby obtain the maximum fine difference value $G_{max}$ and the corresponding fine carrier compensation phase α thereof.

3. The frequency stabilization method for tunable light sources based on characteristic curve reconstruction as claimed in claim 2, wherein in the step 4, the traceable frequency $v_0$ is substituted into H*(v) through the frequency locking point calculation unit (15) to obtain a relationship formula between the reset frequency locking point H⊕($v_0$) and the fine sum value D, and the relationship formula is expressed as follows:

$$H^\oplus(v_0) = m\cos(\varphi_m + \varphi_c - \alpha) \times (1 - a) = D/\left(2 - \frac{3a}{2}\right) \times (1 - a) = D/k;$$

wherein k represents the scale factor, and the reset frequency locking point is obtained through the fine sum value D and the scale factor k.

4. A frequency stabilization system for tunable light sources based on characteristic curve reconstruction, configured to implement the frequency stabilization method for tunable light sources based on characteristic curve reconstruction as claimed in claim 1, wherein the system comprises: a direct digital frequency synthesizer (1), the laser (2), a fiber optic isolator (3), the fiber optic coupler (4), the acetylene absorption chamber (5), the photodetector (6), the analog-to-digital converter (7), the frequency stabilization control system (8), a digital-to-analog converter (9) and a driver (10) sequentially connected in that order, wherein an output end of the driver (10) is connected to the laser (2);

wherein the direct digital frequency synthesizer (1) is configured to generate a sinusoidal signal to perform current modulation on the laser (2), the laser (2) is configured to generate the laser to be input into the fiber optic isolator (3) through fiber optics, the fiber optic coupler (4) is configured to divide the laser into the emergent light and the signal light, the photodetector (6) is configured to convert the signal light passing through the acetylene absorption chamber (5) to the electrical signal, and the electrical signal is configured to pass through the analog-to-digital converter (7), the frequency stabilization control system (8) and the digital-to-analog converter (9) to obtain the controlling signal, to thereby adjust the driving current output from the driver (10) to the laser (2).

\* \* \* \* \*